(12) United States Patent
Nagamune

(10) Patent No.: US 8,214,659 B2
(45) Date of Patent: Jul. 3, 2012

(54) COMMUNICATION DEVICE HAVING PULL-UP VOLTAGE SUPPLY CIRCUIT SUPPLYING PULL-UP VOLTAGE VIA ONE POWER SUPPLY DURING STANDBY STATE AND ANOTHER POWER SUPPLY DURING POWER-ON STATE

(75) Inventor: Atsuhiko Nagamune, Daito (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 992 days.

(21) Appl. No.: 12/228,822

(22) Filed: Aug. 15, 2008

(65) Prior Publication Data

US 2009/0055664 A1    Feb. 26, 2009

(30) Foreign Application Priority Data

Aug. 20, 2007   (JP) ................. 2007-213715

(51) Int. Cl.
   *G06F 1/00*   (2006.01)
(52) U.S. Cl. ....................................... 713/300
(58) Field of Classification Search .............. 713/300, 713/320
   See application file for complete search history.

(56) References Cited

U.S. PATENT DOCUMENTS

| 4,249,091 A | * | 2/1981 | Yamagiwa | 326/32 |
| 4,618,922 A | * | 10/1986 | Hartranft et al. | 363/127 |
| 5,103,158 A | * | 4/1992 | Cho et al. | 323/314 |
| 5,747,889 A |  | 5/1998 | Raynham et al. | |
| 5,917,250 A | * | 6/1999 | Kakalec et al. | 307/18 |
| 5,946,495 A |  | 8/1999 | Scholhamer et al. | |

(Continued)

FOREIGN PATENT DOCUMENTS

JP    61058306 A   *   3/1986

(Continued)

OTHER PUBLICATIONS

Sakai, T.; Matsumoto, S.; Yachi, T.; , "Experimental investigation of dependence of electrical characteristics on device parameters in trench MOS barrier Schottky diodes," Power Semiconductor Devices and ICs, 1998. ISPSD 98. Proceedings of the 10th International Symposium on , pp. 293-296, Jun. 3-6, 1998.*

(Continued)

*Primary Examiner* — Faisal M Zaman
(74) *Attorney, Agent, or Firm* — Yokoi & Co., U.S.A., Inc.; Toshiyuki Yokoi

(57) ABSTRACT

A communication device includes a bus including a signal line supplied with a pull-up voltage Vp, a first power supply operating during both a standby state and a power-ON state, and supplies a source of a first predetermined voltage of 3.3V, a second power supply operating during only the power-ON state, and supplies a source of a second predetermined voltage of 5V, a first device driven by the first power supply, and capable of communicating via the bus when the pull-up voltage Vp is equal to either of 3.3V and 5V, a second device driven by the second power supply, and capable of communicating via the bus when the pull-up voltage Vp is equal to 5V, and a pull-up voltage supply circuit supplying the pull-up voltage Vp by the first power supply during the standby state, and supplying the pull-up voltage Vp by the second power supply during the power-ON state.

2 Claims, 7 Drawing Sheets

U.S. PATENT DOCUMENTS

| | | | | |
|---|---|---|---|---|
| 6,092,207 | A * | 7/2000 | Kolinski et al. | 713/323 |
| 6,188,245 | B1 * | 2/2001 | Kamiya | 326/86 |
| 6,259,304 | B1 * | 7/2001 | Sheng et al. | 327/408 |
| 6,392,441 | B1 * | 5/2002 | Moscaluk | 326/82 |
| 6,775,784 | B1 * | 8/2004 | Park | 713/320 |
| 6,815,843 | B1 * | 11/2004 | Kageyama | 307/42 |
| 7,096,372 | B2 * | 8/2006 | Sone | 713/300 |
| 7,162,654 | B1 | 1/2007 | Price | |
| 7,299,368 | B2 * | 11/2007 | Peker et al. | 713/300 |
| 7,638,975 | B2 * | 12/2009 | Nakamiya et al. | 320/134 |
| 7,664,969 | B2 * | 2/2010 | Ohie et al. | 713/300 |
| 7,734,953 | B1 * | 6/2010 | Sivertsen et al. | 714/14 |
| 7,984,309 | B2 * | 7/2011 | Yamazaki et al. | 713/300 |
| 2004/0145843 | A1 * | 7/2004 | Winick et al. | 361/90 |
| 2005/0099380 | A1 * | 5/2005 | Sase | 345/100 |
| 2006/0250724 | A1 * | 11/2006 | Hayashi et al. | 360/69 |
| 2007/0150767 | A1 * | 6/2007 | Motomiya et al. | 713/300 |
| 2007/0162771 | A1 * | 7/2007 | Chen et al. | 713/300 |
| 2007/0241831 | A1 * | 10/2007 | Mirow | 331/176 |

FOREIGN PATENT DOCUMENTS

| | | | |
|---|---|---|---|
| JP | 01282921 A * | 11/1989 | |
| JP | H03-055921 A | 3/1991 | |
| JP | H06-348378 A | 12/1994 | |
| JP | 11338415 A * | 12/1999 | |
| JP | 2002101667 A * | 4/2002 | |
| JP | 3096674 U | 7/2003 | |
| JP | 2005-018249 A | 1/2005 | |
| JP | 3110950 U | 5/2005 | |
| JP | 3120526 U | 3/2006 | |
| JP | 2009246652 A * | 10/2009 | |
| JP | 2010074967 A * | 4/2010 | |
| WO | 01/95121 A | 12/2001 | |
| WO | WO 2009101804 A1 * | 8/2009 | |

OTHER PUBLICATIONS

Baliga, B.J.; , "The pinch rectifier: A low-forward-drop high-speed power diode," Electron Device Letters, IEEE , vol. 5, No. 6, pp. 194-196, Jun. 1984.*

Fitzgerald, B.; , "A new family of zero voltage switching power supplies," Consumer Electronics, IEEE Transactions on , vol. 43, No. 3, pp. 961-964, Aug. 1997.*

M. Rayabhari; , "Cutting stand-by power," Power Engineer , vol. 17, No. 2, pp. 38-40, Apr./May 2003.*

The extended European search report includes, pursuant to Rule 62 EPC, the supplementary European search report (R.61 EPC) or the partial European search report/ declaration of no search (R.63 EPC) and the European search opinion, Jan. 8, 2009.

Anonymous: "The I2C specification 2.1" N/A, Jan. 1, 2000, XP030001520, p. 43-p. 44.

* cited by examiner

——— LINE FOR PERFORMING COMMUNICATION DURING BOTH STANDBY STATE AND POWER-ON STATE

- - - - LINE FOR PERFORMING COMMUNICATION DURING ONLY POWER-ON STATE

RELATED ART

RELATED ART

RELATED ART

COMMUNICATION DEVICE HAVING PULL-UP VOLTAGE SUPPLY CIRCUIT SUPPLYING PULL-UP VOLTAGE VIA ONE POWER SUPPLY DURING STANDBY STATE AND ANOTHER POWER SUPPLY DURING POWER-ON STATE

CROSS-REFERENCES TO RELATED APPLICATIONS

The present application is related to the Japan Patent Application No. 2007-213715, filed Aug. 20, 2007, the entire disclosure of which is expressly incorporated by reference herein.

BACKGROUND OF THE INVENTION

1. Field of the Invention

The present invention relates to a communication device provided with a bus having a signal line supplied with a pull-up voltage, and for transmitting a predetermined signal.

2. Description of the Related Art

Communication devices provided with a bus having a signal line supplied with a pull-up voltage, and for transmitting a predetermined signal are well known.

For example, JP-A-2005-18249 (hereinafter referred to as Patent Document 1) discloses that by providing an interface circuit with a switch for switching between a first power supply and a second power supply, a plurality of pull-up resistors connected to the switch, and a plurality of data bus lines connected respectively to the plurality of pull-up resistors, in the case in which the mother board is changed, the power supply voltage of the interface circuit can easily be changed in accordance with the power supply voltage of the mother board without changing the pull-up connection of the interface circuit.

Further, JP-A-Hei 6 (1994)-348378 (hereinafter referred to as Patent Document 2) discloses a register unused bit processing circuit which can be reduced in circuit scale by commonly using one new bus driver instead of a plurality of bus drivers for unused bits.

Further, Japanese Utility Model Registration No. 3096674 (hereinafter referred to as Patent Document 3) discloses a bus communication device which lowers the signal level from 5V to 3.3V in the intermediate portion of the bus when sending an H-level signal of 5V from a microcomputer to a device, and then input the signal to the device after restoring the signal to the H-level signal of 5V, thereby preventing the noise generated in the Inter-Integrated Circuit (IIC) bus from influencing analog signals, thus downsizing the circuit board.

Further, Japanese Utility Model Registration No. 3120526 and Japanese Utility Model Registration No. 3110950 (hereinafter referred to as Patent Documents 4, 5) disclose a television set having various circuits such as a microcomputer or a tuner circuit connected to each other via a bus.

Here, the IIC bus described above is a two-wire serial bus composed of a clock line and a data line, and is described as "I²C bus" in some cases. FIG. 5 is a block diagram showing an example in which the IIC bus connects between various kinds of devices such as a microcomputer provided to a television set. In FIG. 5, a main microcomputer 2 and an EEPROM 3, which is a kind of a nonvolatile semiconductor memory, are devices (hereinafter referred to as 3.3V system devices) which are driven by a power supply (hereinafter referred to as a 3.3V system power supply) for supplying a voltage of 3.3V during a standby state and a power-ON state, and can be driven with the voltage (hereinafter referred to as a pull-up voltage) for pulling up the signal line of the I²C bus 1, in a range of 3.3V through 5V. Further, a tuner (TUNER) 4 and a circuit 5 controlled via the I²C bus 1 are devices (hereinafter referred to as 5V system devices), which are driven by a power supply (hereinafter referred to as a 5V system power supply) for supplying a voltage of 5V during only the power-ON state, and can be driven with the pull-up voltage of 5V. Further, in the I²C bus 1, the solid line shows a line for performing communication during both the standby state and the power-ON state, and the broken line shows a line for performing communication during only the power-ON state. It should be noted that the standby state described above denotes, for example, a standby state in which a main power is in an ON state, only a few circuits such as the microcomputer are supplied with the power waiting for various operations (e.g., a power-ON operation) by the user, or waiting along a reservation program. Further, the power-ON state described above denotes, for example, a normal operation condition in which other circuits necessary for the operation are also supplied with the power for displaying picture on a screen or outputting sounds from a speaker.

In order for performing communication including the broken line sections during the power-ON state in the configuration including a signal line of the bus having different communication paths between the standby state and the power-ON state as described above, since the 3.3V system power supply is not capable of supplying the pull-up voltage, it can be considered to operate the 5V system power supply during also the standby state to supply the pull-up voltage by the 5V system power supply. In such a case, the 5V system devices are also driven during the standby state, thus there is a possibility that the power consumption (so-called standby power) during the standby state does not comply with the requirements of the International Energy Star Program.

Therefore, it can be considered that as shown in FIG. 6, to newly add a bus-dedicated power supply (hereinafter referred to as I²C-dedicated power supply) 6 for only supplying the 5V pull-up voltage. Alternatively, as shown in FIG. 7, it can also be considered that the pull-up voltage between the 3.3V system devices is supplied by the 3.3V system power supply while the pull-up voltage between the 5V system devices is supplied by the 5V system power supply, and at the same time, a pull-up voltage conversion circuit (hereinafter referred to as a 3.3V←→5V conversion circuit) 7 having a MOS configuration, for example, is newly added in the signal line of the I²C bus.

However, there is a possibility that increase in cost is caused by newly adding the I²C-dedicated power supply or the 3.3V←→5V conversion circuit 7. Further, in the case of FIG. 6, there is a possibility that increase in the standby power is caused by raising the pull-up voltage to 5V.

BRIEF SUMMARY OF THE INVENTION

The present invention has been made in view of the above problems, and has an object of providing a communication device capable of achieving cost reduction while suppressing the standby power in the configuration including a signal line of the bus having different communication paths between the standby state and the power-ON state.

In order for achieving the object described above, a communication device according to the present invention is provided with a configuration including a bus including a signal line supplied with a pull-up voltage, and for transmitting a predetermined signal, a first power supply operating during both a standby state and a power-ON state, and acting as a supply source of a first predetermined voltage, a second power supply operating during the power-ON state and not operating during the standby state, and acting as a supply source of a second predetermined voltage a predetermined value higher than the first predetermined voltage, a first device driven by the first power supply, and capable of performing a communication via the bus in the condition in which the pull-up voltage is equal to either of the first predetermined voltage and the second predetermined voltage, a second device driven by the second power supply, and capable of performing a communication via the bus in the condition in which the pull-up voltage is equal to the second predetermined voltage, and a pull-up voltage supply circuit for supplying the pull-up voltage by the first power supply during the standby state while supplying the pull-up voltage by the second power supply during the power-ON state.

In the communication device according to the invention configured as described above, since the first device and the second device are connected to the signal line in the same bus and perform communications, the signal line of the bus having the communication path varies between in the standby state and the power-ON state exists. Further, since the pull-up voltage is supplied by the first power supply during the standby state and the pull-up voltage is supplied by the second power supply during the power-ON state owing to the pull-up voltage supply circuit, the pull-up voltage is set to the first predetermined voltage during the standby state, and the pull-up voltage is set to the second predetermined voltage during the power-ON state, thus the communications can appropriately be performed.

As explained hereinabove, according to the present invention, since the pull-up voltage is set to the first predetermined voltage in the standby state, and the pull-up voltage is set to the second predetermined voltage during the power-ON state, thus the communications can appropriately be performed, in the configuration including the signal of the bus having the communication path varying between in the standby state and in the power-ON state, a communication device capable of achieving cost reduction while suppressing the standby power can be obtained in comparison with the case in which, for example, the bus-dedicated power supply or the pull-up voltage conversion circuit is newly added.

Further, as a preferable aspect of the invention, it is possible that the pull-up voltage supply circuit includes a first diode disposed in series between the first power supply and the signal line so as to allow supply of the pull-up voltage from the first power supply to the signal line and to block flow of a current from the second power supply to the first power supply, and a second diode disposed in series between the second power supply and the signal line so as to allow supply of the pull-up voltage from the second power supply to the signal line and to block flow of a current from the first power supply to the second power supply.

By thus configured, although the diodes are added, multipurpose diodes can be used therefor since the current flowing through the bus is small enough, further, the pull-up voltage is appropriately supplied from the first power supply to the signal line during the standby state, and during the power-ON state in which the second power supply is operated, the pull-up voltage is supplied appropriately from the second power supply to the signal line.

According to the present aspect, by only adding the diodes, since the pull-up voltage is appropriately supplied from the first power supply to the signal line during the standby state, and meanwhile, during the power-ON state in which the second power supply is operated, the pull-up voltage is supplied from the second power supply to the signal line appropriately, although the diodes are added, multipurpose diodes can be used therefor since the current flowing through the bus is small enough, and cost reduction can be achieved while suppressing the standby power in comparison with new addition of, for example, the bus-dedicated power supply of the pull-up voltage conversion circuit.

Further, as a preferable aspect of the invention, it is possible that the pull-up voltage supply circuit includes a third diode having a characteristic comparable with the characteristic of the first diode, and disposed in series between the first power supply and the first device having a direction from the first power supply towards the first device as a forward direction, and a fourth diode having a characteristic comparable with the characteristic of the second diode, and disposed in series between the second power supply and the second device having a direction from the second power supply towards the second device as a forward direction.

By thus configured, the forward voltage drop comparable with the forward voltage drop caused by the first diode can be generated between the first power supply and the first device by the third diode. Further, the forward voltage drop comparable with the forward voltage drop caused by the second diode can be generated between the second power supply and the second device by the fourth diode.

Further, according to the present aspect, since the forward voltage drop comparable with the forward voltage drop caused by the first diode can be generated between the first power supply and the first device by the third diode, the first predetermined voltage is properly supplied to the first device. Further, since the forward voltage drop comparable with the forward voltage drop caused by the second diode can be generated between the second power supply and the second device by the fourth diode, the second predetermined voltage is properly supplied to the second device.

Further, as a preferable aspect of the invention, it is possible that the first power supply supplies a first power supply voltage obtained by adding a voltage corresponding to a forward voltage drop of the first and third diodes to the first predetermined voltage, and the second power supply supplies a second power supply voltage obtained by adding a voltage corresponding to a forward voltage drop of the second and fourth diodes to the second predetermined voltage.

By thus configured, the first predetermined voltage is appropriately supplied to the first device, and at the same time, the pull-up voltage is appropriately set to the first predetermined voltage during the standby state. In addition, during the power-ON state, the first predetermined voltage is appropriately supplied to the first device, the second predetermined voltage is appropriately supplied to the second device, and at the same time, the pull-up voltage is set appropriately to the second predetermined voltage.

Further according to the present invention, since the first predetermined voltage is appropriately supplied to the first device and the pull-up voltage is appropriately set to the first predetermined voltage during the standby state, and on the other hand, during the power-ON state, the first predetermined voltage is appropriately applied to the first device, and the second predetermined voltage is appropriately supplied to the second device, and the pull-up voltage is appropriately set to the second predetermined voltage, the first device and the second device are appropriately driven, and the communications between the devices can appropriately be performed.

Further, as a preferable aspect of the invention, it is possible that the bus is an IIC bus, which is a two-wire serial bus, the first predetermined voltage is 3.3V, the second predetermined voltage is 5V, the first device corresponds to a microcomputer and a storage section provided to a flat-screen television set, the second device corresponds to a tuner and a signal processing circuit provided to the flat-screen television set, the pull-up voltage is supplied to the signal line via a pull-up resistor, the pull-up voltage supply circuit includes a first diode disposed in series between the first power supply and the pull-up resistor so as to allow supply of the pull-up voltage from the first power supply to the signal line and to block flow of a current from the second power supply to the first power supply, a second diode disposed in series between the second power supply and the pull-up resistor so as to allow supply of the pull-up voltage from the second power supply to the signal line and to block flow of a current from the first power supply to the second power supply, a third diode having a characteristic comparable with the characteristic of the first diode, and disposed in series between the first power supply and the first device having a direction from the first power supply towards the first device as a forward direction, and a fourth diode having a characteristic comparable with the characteristic of the second diode, and disposed in series between the second power supply and the second device having a direction from the second power supply towards the second device as a forward direction, and the first power supply supplies a first power supply voltage obtained by adding a voltage corresponding to a forward voltage drop of the first and third diodes to the first predetermined voltage of 3.3V, the second power supply supplies a second power supply voltage obtained by adding a voltage corresponding to a forward voltage drop of the second and fourth diodes to the second predetermined voltage of 5V, and the communication device is implemented in the flat-panel television set.

By thus configured, in the communication device implemented in the flat-panel television composed of the I²C bus, although the four diodes are added, multipurpose diodes can be used therefor since the current flowing through the bus is small enough, further, the pull-up voltage is appropriately supplied from the first power supply to the signal line during the standby state, and during the power-ON state in which the second power supply is operated, the pull-up voltage is supplied appropriately from the second power supply to the signal line. Further, the forward voltage drop comparable with the forward voltage drop caused by the first diode can be generated between the first power supply and the first device by the third diode. Further, the forward voltage drop comparable with the forward voltage drop caused by the second diode can be generated between the second power supply and the second device by the fourth diode. Further, during the standby state, the first predetermined voltage of 3.3V is appropriately supplied to the first device, and at the same time, the pull-up voltage is also set appropriately to 3.3V. In addition, during the power-ON state, 3.3V is appropriately supplied to the first device, 5V is appropriately supplied to the second device, and at the same time, the pull-up voltage is set appropriately to 5V.

According to the present aspect of the invention, since in the communication device implemented in the flat-panel television composed of the I²C bus, although the four diodes are added, multipurpose diodes can be used therefor since the current flowing through the bus is small enough, further, the pull-up voltage is appropriately supplied from the first power supply to the signal line during the standby state, and during the power-ON state in which the second power supply is operated, the pull-up voltage is supplied appropriately from the second power supply to the signal line, the cost reduction can be achieved while suppressing the standby power in comparison with the case in which, for example, the I²C-dedicated power supply or the 3.3V←→5V conversion circuit is newly added. Further, the forward voltage drop comparable with the forward voltage drop caused by the first diode can be generated between the first power supply and the first device by the third diode. Further, the forward voltage drop comparable with the forward voltage drop caused by the second diode can be generated between the second power supply and the second device by the fourth diode. Further, since 3.3V is appropriately supplied to the first device and the pull-up voltage is appropriately set to 3.3V during the standby state, and on the other hand, during the power-ON state, 3.3V is appropriately applied to the first device, and 5V is appropriately supplied to the second device, and the pull-up voltage is appropriately set to 5V, the first device and the second device are appropriately driven, and the communications between the devices can appropriately be performed.

DETAILED DESCRIPTION OF THE INVENTION

Figure 1:
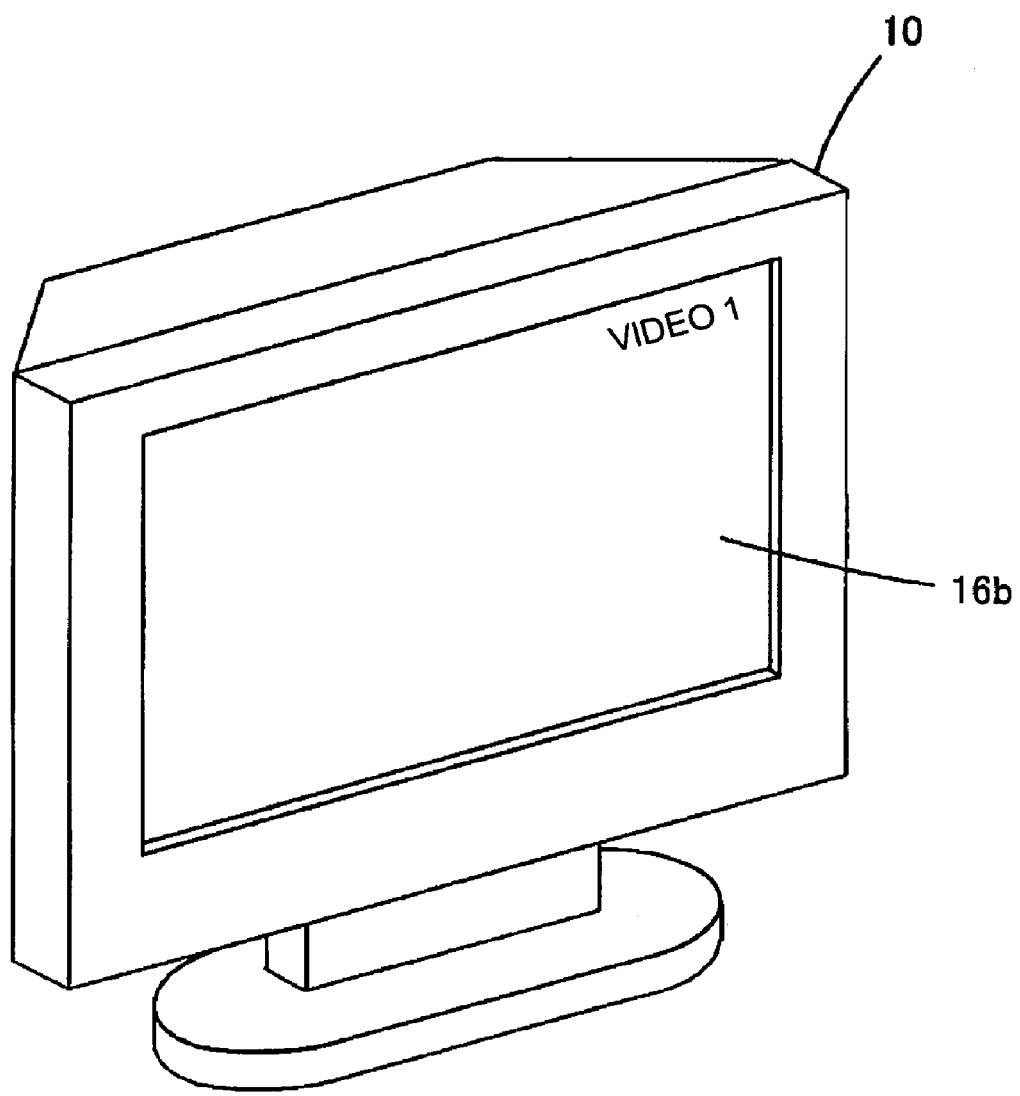
FIG. 1 is a perspective view showing an example of a liquid crystal television set equipped with a communication device to which the present invention is applied.
Figure 2:
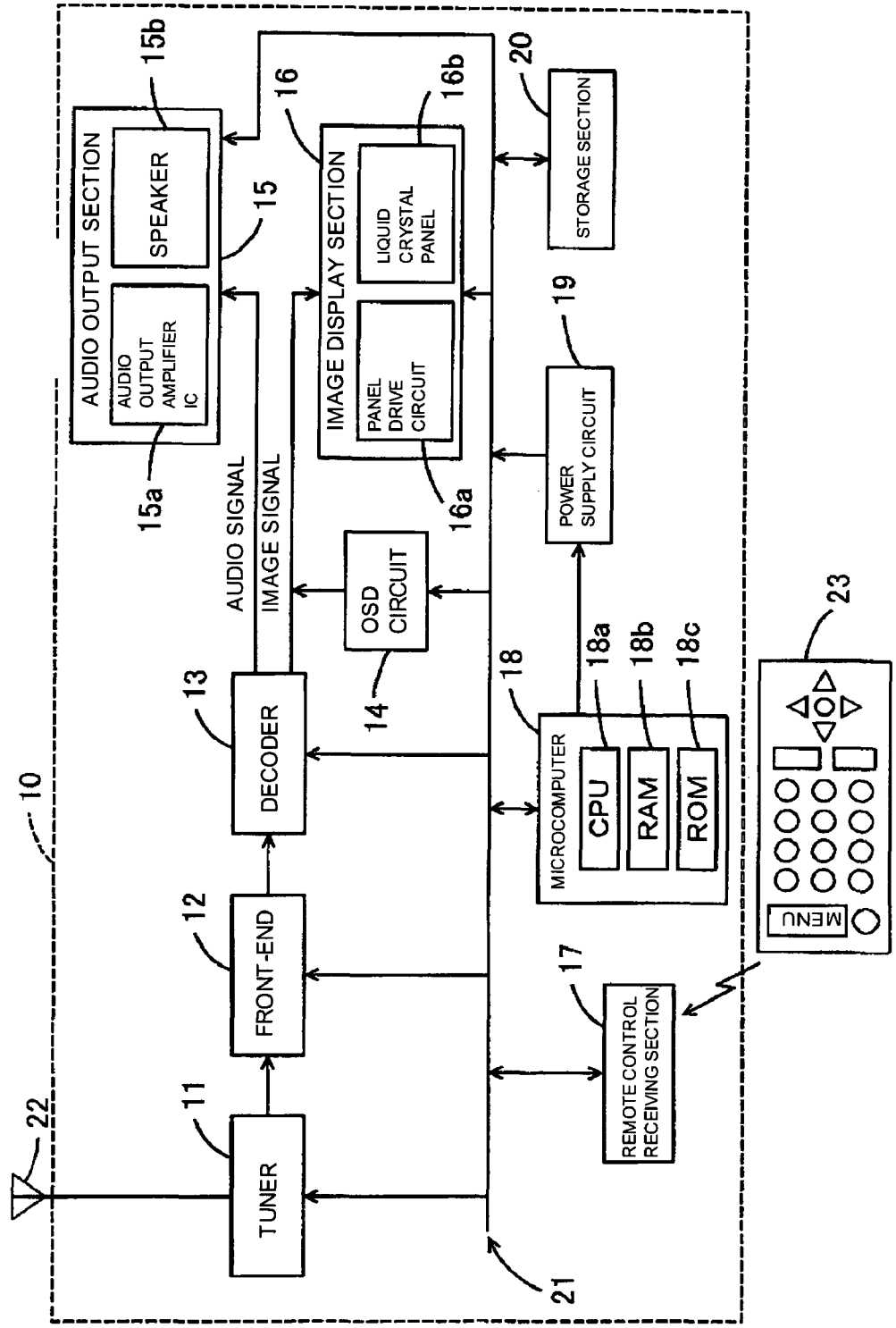
FIG. 2 is a block diagram exemplifying a configuration of the liquid crystal television set.

Hereinafter, an embodiment of the present invention will be explained with reference to the accompanying drawings.
1. Schematic Configuration of Flat-Screen Television Set Equipped With Communication Device
2. Configuration of Communication Device
3. Specific Circuit Configuration of Pull-Up Voltage Supply Circuit
4. Conclusion 1. SCHEMATIC CONFIGURATION OF FLAT-SCREEN TELEVISION SET EQUIPPED WITH COMMUNICATION DEVICE Hereinafter, a schematic configuration of the liquid crystal television set 10 as an example of the flat-screen television equipped with a communication device 30 (see FIG. 3) to which the present invention is applied will be explained with reference to FIGS. 1 and 2. FIG. 1 is a perspective view showing the liquid crystal television set 10, and FIG. 2 is a block configuration diagram of the liquid crystal television set 10. It should be noted that although in the present embodiment, the liquid crystal television set is exemplified as a flat-screen television to which the present invention is applied, the present invention is not limited to the present embodiment, but can be applied to any display devices capable of displaying an image including a flat-screen television set such as a plasma television, a rear projection television, or an organic EL television, a flat-screen display such as a liquid crystal display or a plasma display, or a projector for projecting an image on the screen and not provided with the television function, and various modified embodiments are possible within the scope or the spirit of the present invention. Further, besides the flat-screen television sets, the present invention can be applied to any devices equipped with a communication device including a bus having a signal line supplied with the pull-up voltage and for transmitting a predetermined signal. For example, the present invention can be applied to audio-visual apparatuses equipped with a communication device described above.

In FIGS. 1 and 2, the liquid crystal television set 10 is provided with a tuner 1, a front-end 12, a decoder 13, an OSD circuit 14, an audio output section 15, an image display section 16, a remote control receiving section 17, a microcomputer 18, a power supply circuit 19, and a storage section 20. These constituents such as the microcomputer 18 are connected to each other via a bus 21.

The tuner 11 is connected to, for example, an antenna 22, obtains a television broadcasting signal corresponding to a channel (e.g., the channel tuned by the user) out of the television broadcasting signals received by the antenna 22, and outputs the signal to the front-end 12 in accordance with a control signal input from the microcomputer 18.

The front-end 12 converts the television broadcasting signal output from the tuner 11 into an intermediate frequency signal, and outputs the intermediate frequency signal to the decoder 13 in accordance with the control signal input, for example, the microcomputer 18.

The decoder 13 executes a process corresponding to a predetermined file format (e.g., a well-known MPEG-2 format) on the intermediate frequency signal output from the front-end 12, thereby decoding the intermediate frequency signal while separating the intermediate frequency signal into an audio signal and an image signal in accordance with, for example, the control signal input from the microcomputer 18. Then, the decoder 13 outputs the audio signal thus decoded to the audio output section 15, and at the same time, outputs the image signal to the image display section 16.

The OSD circuit 14 combines an OSD display signal for making the image display section 16 perform a predetermined OSD display (an on-screen display) with the image signal output from the decoder 13 to the image display section 16 in accordance with, for example, the control signal input from the microcomputer 18.

The audio output section 15 is provided with, for example, a audio output amplifier IC 15a and a speaker 15b, executes a predetermined processing such as power amplification by the audio output amplifier IC 15a on the audio signal input from the decoder 13, and output a sound corresponding to the audio data based on the audio signal from the speaker 15b.

The image display section 16 is provided with, for example, a panel drive circuit 16a and a liquid crystal panel 16b, and so on, and display an image corresponding to the image data based on the image signal output from the decoder 13 or an image corresponding to the image data based on the image signal output from the decoder 13 and combined with the OSD display signal by the OSD circuit 14.

The remote control receiving section 17 receives various kinds of signals (a control command) transmitted from, for example, a remote controller 23, and outputs various data based on the various signals to the microcomputer 18.

The remote controller 23 is operated by, for example, the user, and transmits the various signals corresponding to the operation to the remote control receiving section 17 using, for example, an infrared beam or an electric wave.

The microcomputer 18 is provided with, for example, a CPU 18a, a RAM 18b, and a ROM 18c, and controls the operations of the liquid crystal television set 10. For example, the microcomputer 18 controls powering ON/OFF, switching of the channel, turning up/down the volume, and so on based on a control command received by the remote control receiving section 17.

The CPU 18a executes various control operations along various kinds of processing programs for the liquid crystal television set 10 stored in the ROM 18c.

The RAM 18b is provided with a program storage area for developing the processing program or the like executed by the CPU 18a and a data storage area for storing the input data or the processing result generated when executing the processing program described above.

The ROM 18c stores a system program which can be executed in the liquid crystal television set 10, various kinds of processing programs which can be executed in the system program, and data used when these various kinds of processing programs. It should be noted that the programs are stored in the ROM 18c in the form of computer readable program codes.

The power supply circuit 19 is, for example, a partial resonance power supply circuit, and converts the commercial AC power into a plurality of kinds of predetermined voltages, and outputs operation power supply voltages to various sections of the liquid crystal television set 10.

The storage section 20 is composed of a nonvolatile semiconductor memory such as an EEPROM, and stores the channel information corresponding to the broadcasting signals, various adjustment values set by the user, and so on.

2. CONFIGURATION OF COMMUNICATION DEVICE

Figure 3:
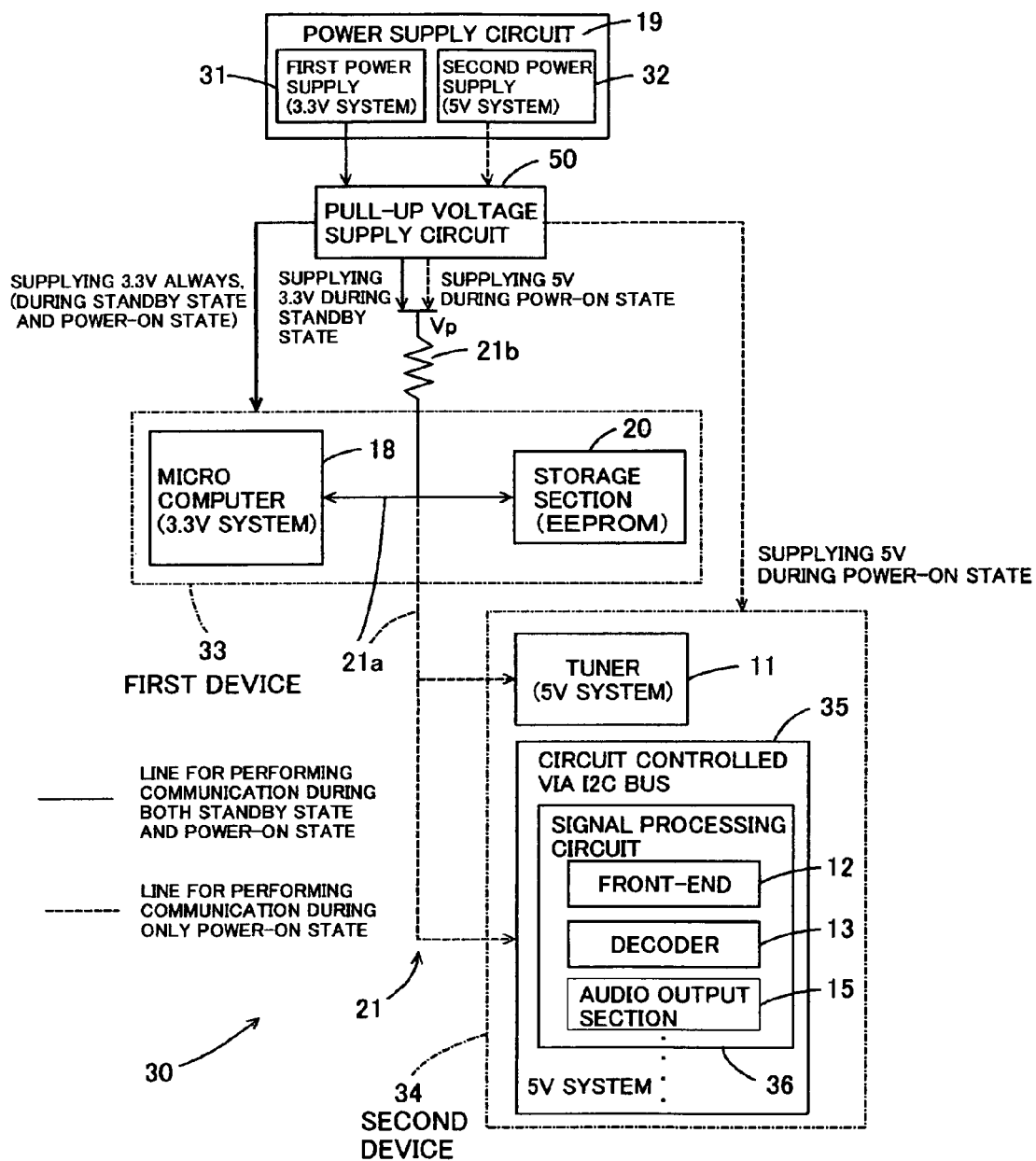
FIG. 3 is a block diagram exemplifying a schematic configuration of the communication device.

FIG. 3 is a block configuration diagram showing an outline of the communication device 30 implemented in the liquid crystal television set 10. In FIG. 3, the communication device 30 is composed of a bus 21 provided to, for example, the liquid crystal television set 10, a first power supply 31, a second power supply 32, a first device 33, a second device 34, and a pull-up voltage supply circuit 50.

The bus 21 is, for example, the I²C bus, which is a well-known two-line serial bus, provided with a signal line 21a supplied with a pull-up voltage Vp, and transmits a predetermined signal. The pull-up voltage Vp is a voltage for pulling up the signal line 21a of the bus 21, and is supplied to the signal line 21a via a pull-up resistor 21b.

The first power supply 31 is provided, for example, to the power supply circuit 19, and is a 3.3V system power supply operating during both the standby state and the power-ON state to act as the supply source of the first predetermined voltage of, for example, 3.3V.

The second power supply 32 is provided, for example, to the power supply circuit 19, and is a 5V system power supply operating during only the power-ON state to act as the supply source of the second predetermined voltage of, for example, 5V which is a predetermined value higher than the first predetermined voltage of 3.3V.

The first device 33 is a 3.3V system device, which is driven by the first power supply 31 operating during both the standby state and the power-ON state, and capable of performing communication via the bus 21 in the case in which the pull-up voltage Vp is the first predetermined voltage of 3.3V and in the case in which the pull-up voltage Vp is the second predetermined voltage of 5V (in other words, capable of operating with the pull-up voltage Vp of 3.3V through 5V), and corresponds, for example, to the microcomputer 18, the storage section 20, the remote control receiving section 17, and so on.

Further, the second device 34 is a 5V system device which is driven by the second power supply 32 operating during only the power-ON state, and is capable of performing communication via the bus 21 in the case in which the pull-up voltage Vp is the second predetermined voltage of 5V (in other words, capable of operating with the pull-up voltage Vp of 5V), and corresponds, for example, the tuner 11, and the circuit 35 controlled via the bus 21. The circuit 35 is specifically the signal processing circuit 36 such as the front-end 12, the decoder 13, or the audio output section 15.

The pull-up voltage supply circuit 50 is provided with a configuration of supplying the pull-up voltage by the first power supply 31 during the standby state on the one hand, and on the other hand during the power-ON state, supplying the pull-up voltage by the second power supply 32.

In the communication device 30 thus configured, the solid line in the bus 21 represents the signal line (a line) for performing communication during both the standby state and the power-ON state, and the broken line represents a signal line for performing communication during only the power-ON state. In other words, since the first device 33 and the second device 34 perform communication while connected to the signal line 21a of the same bus 21, the signal line 21a of the bus 21 having a communication path varying between in the standby state and in the power-ON state exists.

The pull-up voltage supply circuit 50 is a circuit for appropriately performing the communication including the broken line section during the power-ON state in such a configuration as to include the signal line 21a of the bus 21 having a communication path varying between in the standby state and in the power-ON state.

It should be noted that the standby state described above denotes, for example, a standby state in which the main power of the power supply circuit 19 is in an ON state, only the first device 33 such as the microcomputer 18 is supplied with the power waiting for various operations (e.g., a power-ON operation) by the user, or waiting along a reservation program. Further, the power-ON state described above denotes a normal operation condition in which the second device 34 such as the tuner 11 is also supplied with the power, and an image is displayed on the liquid crystal panel 16b, or a sound is output from the speaker 15b, for example.

3. SPECIFIC CIRCUIT CONFIGURATION OF PULL-UP VOLTAGE SUPPLY CIRCUIT

Figure 4:
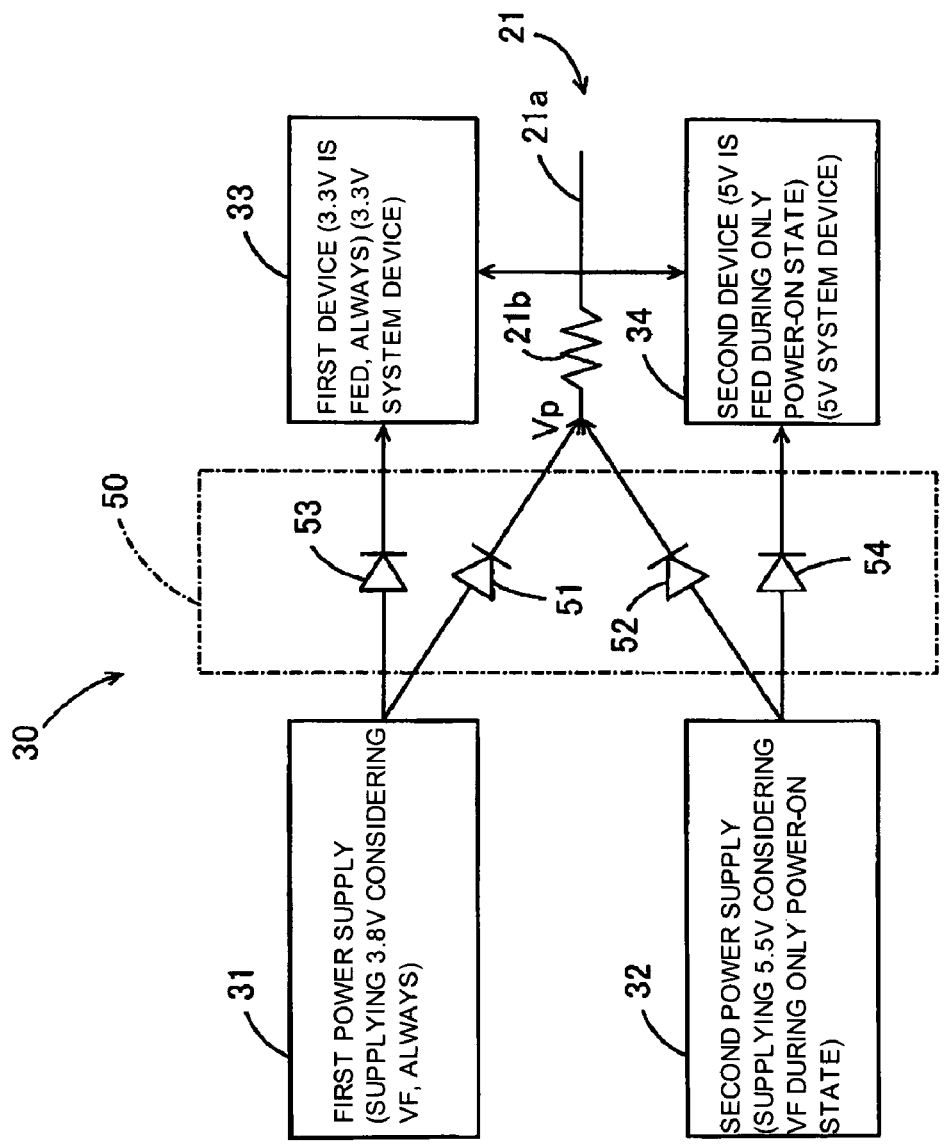
FIG. 4 is a diagram exemplifying a specific circuit configuration of a pull-up voltage supply circuit.
Figure 5:
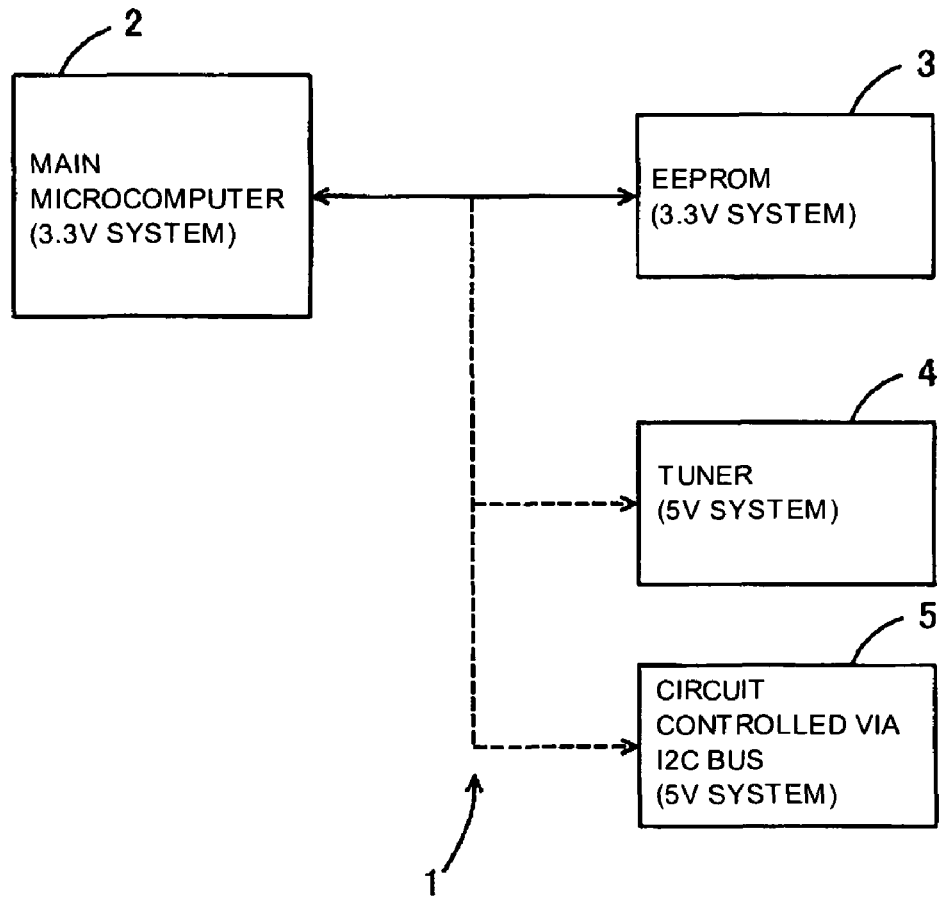
FIG. 5 is a block diagram exemplifying an example of the related art in which the I²C bus connects between various kinds of devices such as a microcomputer provided to a television set.
Figure 6:
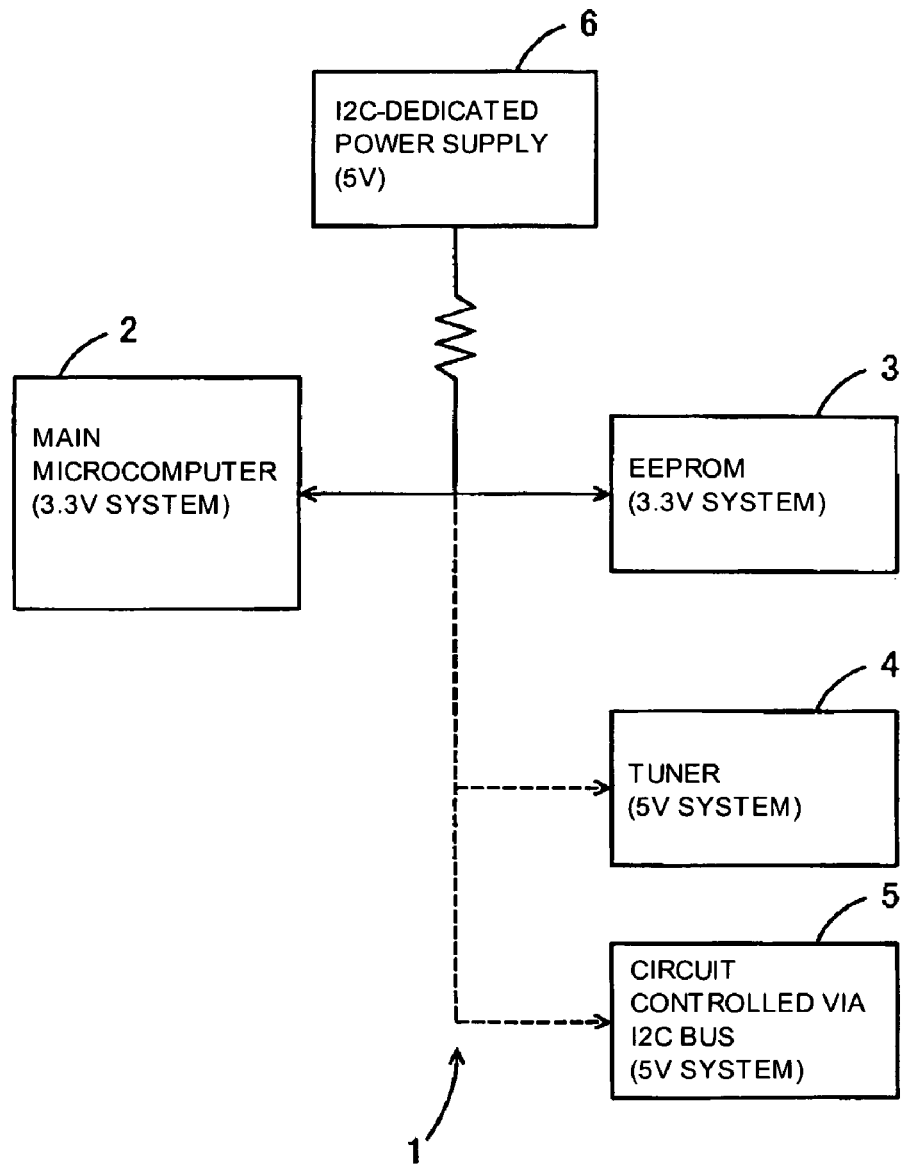
FIG. 6 is a block diagram exemplifying an example of the related art supplying the pull-up voltage to the I²C bus.
Figure 7:
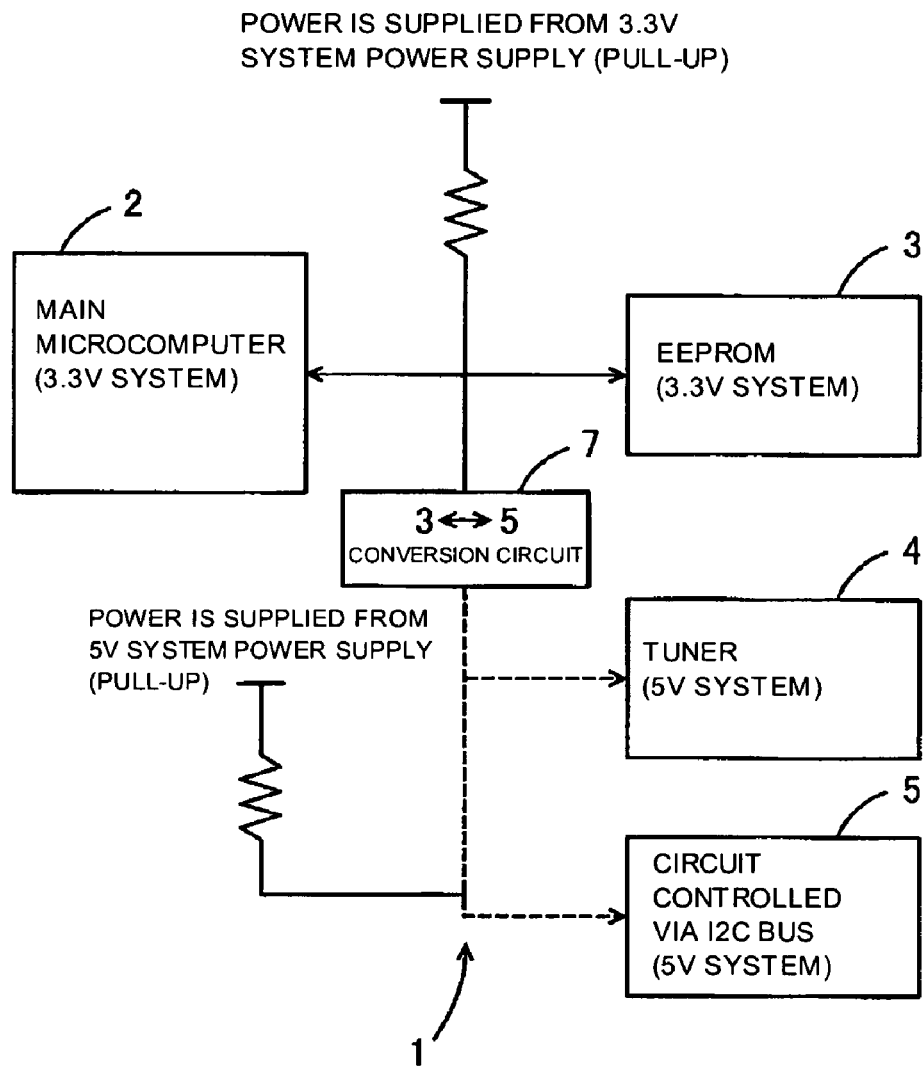
FIG. 7 is a block diagram exemplifying another example of the related art supplying the pull-up voltage to the I²C bus.

FIG. 4 is a diagram showing a specific circuit configuration of the pull-up voltage supply circuit.

In FIG. 4, the pull-up voltage supply circuit 50 is provided with a first diode 51 disposed in series between the first power supply 31 and the pull-up resistor 21b (the signal line 21a) so as to allow supply of the pull-up voltage Vp from, for example, the first power supply 31 to the pull-up resistor 21b (the signal line 21a) while blocking flow of a current from the second power supply 32 to the first power supply 31, a second diode 52 disposed in series between the second power supply 32 and the pull-up resistor 21b (the signal line 21a) so as to allow supply of the pull-up voltage Vp from the second power supply 32 to the pull-up resistor 21b (the signal line 21a) while blocking flow of a current from the first power supply 31 to the second power supply 32, a third diode 53 having a comparable characteristic with the first diode 51 and disposed in series between the first power supply 31 and the first device 33 with the direction from the first power supply 31 towards the first device 33 as the forward direction, and a fourth diode 54 having a comparable characteristic with the second diode 52 and disposed in series between the second power supply 32 and the second device 34 with the direction from the second power supply 32 towards the second device 34 as the forward direction.

In such a configuration, the first power supply 31 supplies the first power supply voltage of about 3.8V obtained by adding, for example, about 0.5V as the forward voltage drop VF to the first predetermined voltage of 3.3V taking the forward voltage drop VF of the first diode 51 and the third diode 53 into consideration.

Further, the second power supply 32 supplies the second power supply voltage of about 5.5V obtained by adding, for example, about 0.5V as the forward voltage drop VF to the second predetermined voltage of 5V taking the forward voltage drop VF of the second diode 52 and the fourth diode 54 into consideration.

In the case of the present embodiment, since the current flowing through the bus 21 is relatively small, multipurpose diodes can be used as the first diode 51, the second diode 52, the third diode 53, and the fourth diode 54. In other words, in order for appropriately performing communications including the broken line section during the power-ON state in the configuration including the signal line 21a of the bus 21 having the communication path varying between in the standby state and the power-ON state as in the present embodiment, the multipurpose diodes can be used having an advantage in cost in comparison with the case in which, for example, the I$^2$C-dedicated power supply or the 3.3V$\leftarrow\rightarrow$5V conversion circuit is newly added separately to the pull-up voltage supply circuit 50.

By thus configured, since the pull-up voltage Vp is supplied by the first power supply 31 during the standby state while the pull-up voltage Vp is supplied by the second power supply 32 during the power-ON state owing to the pull-up voltage supply circuit 50, the pull-up voltage Vp is set to the first predetermined voltage of 3.3V during the standby state while the pull-up voltage Vp is set to 5V during the power-ON state, thus the communications can appropriately be performed.

Further, although the four diodes 51 through 54 are added, the multipurpose diodes can sufficiently be used therefor since only a small current flows through the bus 21, and further, the pull-up voltage Vp is properly supplied from the first power supply 31 to the signal line 21a during the standby state while during the power-ON state in which the second power supply 32 is operated, the pull-up voltage Vp is appropriately supplied to the signal line 21a from the second power supply 32.

Further, the forward voltage drop comparable with the forward voltage drop VF caused by the first diode 51 can be provided by the third diode 53 between the first power supply 31 and the first device 33, and the forward voltage drop comparable with the forward voltage drop VF caused by the second diode 52 can be provided by the fourth diode 54 between the second power supply 32 and the second device 34. Further, during the standby state, the first predetermined voltage of 3.3V is appropriately supplied to the first device 33, and at the same time, the pull-up voltage is also set appropriately to the first predetermined voltage of 3.3V. In addition, during the power-ON state, the first predetermined voltage of 3.3V is appropriately supplied to the first device 33, the second predetermined voltage of 5V is appropriately supplied to the second device 34, and at the same time, the pull-up voltage Vp is set appropriately to the second predetermined voltage of 5V.

4. CONCLUSION

As described above, according to the present embodiment, since the pull-up voltage Vp is set to the first predetermined voltage of 3.3V during the standby state while the pull-up voltage Vp is set to the second predetermined voltage of 5V during the power-ON state, thus the communications can appropriately be performed, in the configuration including the signal line 21a of the bus 21 having the communication path varying between in the standby state and in the power-ON state, the communication device 30 capable of achieving cost reduction while suppressing the standby power can be provided in comparison with the case in which, for example, the I$^2$C-dedicated power supply or the 3.3V←→5V conversion circuit is newly added.

Further, according to the present embodiment, although the four diodes are added, multipurpose diodes can sufficiently be used as the four diodes since only a small current flows through the I$^2$C bus, thus the cost reduction can be achieved while suppressing the standby power in comparison with the case in which, for example, the I$^2$C-dedicated power supply or the 3.3V←→5V conversion circuit is newly added.

Further, according to the present embodiment, the forward voltage drop VF comparable with that caused by the first diode 51 can be provided by the third diode 53, and the forward voltage drop VF comparable with that caused by the second diode 52 can be provided by the fourth diode 54. Further, since the first predetermined voltage of 3.3V is appropriately supplied during the standby state while the first predetermined voltage of 3.3V and the second predetermined voltage of 5V is appropriately supplied during the power-ON state, the first device 33 and the second device 34 are appropriately driven, and at the same time, the communications between the devices are properly executed.

Although the embodiment of the present invention is hereinabove explained in detail with reference to the accompanying drawings, the above descriptions are nothing more than one embodiment of the present invention, and the present invention can be put into practice in the forms added with various modifications and improvements based on knowledge of those skilled in the art.

While the invention has been particularly shown and described with respect to preferred embodiment thereof, it should be understood by those skilled in the art that the foregoing and other changes in form and detail may be made therein without departing from the spirit and scope of the invention as defined in the appended claims.

What is claimed is:

1. A communication device, comprising:
a bus, including a signal line supplied with a pull-up voltage, and for transmitting a predetermined signal;
a first power supply operating during both a standby state and a power-ON state, and acting as a supply source of a first predetermined voltage;
a second power supply operating during the power-ON state and not operating during the standby state, and acting as a second supply source of a second predetermined voltage, which is a predetermined value higher than the first predetermined voltage;
a pull-up voltage supply circuit, connected with the first power supply and the second power supply, for supplying the pull-up voltage;
a first device connected with the pull-up voltage supply circuit by the bus;
a second device connected with the pull-up voltage supply circuit and the first device by the bus;
the pull-up voltage supply circuit supplies the pull-up voltage equal to the first predetermined voltage to the first device via the bus during the standby state, while supplying the pull-up voltage equal to the second predetermined voltage to the first device and the second device via the bus during the power-ON state; and
the first device is driven by the first power supply, and capable of performing a communication via the bus in the condition in which the pull-up voltage is equal to either of the first predetermined voltage and the second predetermined voltage,
the second device is driven by the second power supply, and capable of performing a communication via the bus in the condition in which the pull-up voltage is equal to the second predetermined voltage, wherein
the pull-up voltage supply circuit includes
a first diode disposed in series between the first power supply and the signal line so as to allow supply of the pull-up voltage from the first power supply to the signal line and to block flow of a current from the second power supply to the first power supply,
a second diode disposed in series between the second power supply and the signal line so as to allow supply of the pull-up voltage from the second power supply to the signal line and to block flow of a current from the first power supply to the second power supply,
a third diode having a characteristic comparable with the characteristic of the first diode, and disposed in series between the first power supply and the first device having a direction from the first power supply towards the first device as a forward direction, and
a fourth diode having a characteristic comparable with the characteristic of the second diode, and disposed in series between the second power supply and the second device having a direction from the second power supply towards the second device as a forward direction,
the first power supply supplies a first power supply voltage obtained by adding a voltage corresponding to a forward voltage drop of the first and third diodes to the first predetermined voltage, and
the second power supply supplies a second power supply voltage obtained by adding a voltage corresponding to a forward voltage drop of the second and fourth diodes to the second predetermined voltage.

2. A communication device, comprising:
a bus, including a signal line supplied with a pull-up voltage, and for transmitting a predetermined signal;
a first power supply operating during both a standby state and a power-ON state, and acting as a supply source of a first predetermined voltage;
a second power supply operating during the power-ON state and not operating during the standby state, and acting as a second supply source of a second predetermined voltage, which is a predetermined value higher than the first predetermined voltage;
a pull-up voltage supply circuit, connected with the first power supply and the second power supply, for supplying the pull-up voltage;
a first device connected with the pull-up voltage supply circuit by the bus;
a second device connected with the pull-up voltage supply circuit and the first device by the bus;
the pull-up voltage supply circuit supplies the pull-up voltage equal to the first predetermined voltage to the first device via the bus during the standby state, while supplying the pull-up voltage equal to the second predetermined voltage to the first device and the second device via the bus during the power-ON state; and
the first device is driven by the first power supply, and capable of performing a communication via the bus in the condition in which the pull-up voltage is equal to either of the first predetermined voltage and the second predetermined voltage, the second device is driven by the second power supply, and capable of performing a communication via the bus in the condition in which the pull-up voltage is equal to the second predetermined voltage, wherein the bus is an IIC bus, which is a two-wire serial bus, the first predetermined voltage is 3.3V, the second predetermined voltage is 5V, the first device corresponds to a microcomputer and a storage section provided to a flat-screen television set, the second device corresponds to a tuner and a signal processing circuit provided to the flat-screen television set, the pull-up voltage is supplied to the signal line via a pull-up resistor, the pull-up voltage supply circuit includes a first diode disposed in series between the first power supply and the pull-up resistor so as to allow supply of the pull-up voltage from the first power supply to the signal line and to block flow of a current from the second power supply to the first power supply, a second diode disposed in series between the second power supply and the pull-up resistor so as to allow supply of the pull-up voltage from the second power supply to the signal line and to block flow of a current from the first power supply to the second power supply, a third diode having a characteristic comparable with the characteristic of the first diode, and disposed in series between the first power supply and the first device having a direction from the first power supply towards the first device as a forward direction, and a fourth diode having a characteristic comparable with the characteristic of the second diode, and disposed in series between the second power supply and the second device having a direction from the second power supply towards the second device as a forward direction, and the first power supply supplies a first power supply voltage obtained by adding a voltage corresponding to a forward voltage drop of the first and third diodes to the first predetermined voltage of 3.3V, the second power supply supplies a second power supply voltage obtained by adding a voltage corresponding to a forward voltage drop of the second and fourth diodes to the second predetermined voltage of 5V, and the communication device is implemented in the flat-screen television set.

* * * * *